United States Patent
Kuroda (10) Patent No.: US 7,102,413 B2
(45) Date of Patent: Sep. 5, 2006

(54) SEMICONDUCTOR INTEGRATED CIRCUIT DEVICE

(75) Inventor: Naoki Kuroda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/726,302

(22) Filed: Dec. 1, 2003

(65) Prior Publication Data

US 2004/0109368 A1 Jun. 10, 2004

(30) Foreign Application Priority Data

Dec. 3, 2002 (JP) ......................................... 2002-351687

(51) Int. Cl.
*H03K 17/62* (2006.01)

(52) U.S. Cl. ...................................................... 327/408
(58) Field of Classification Search ................. 327/333, 327/407, 408, 530, 534, 540, 541
See application file for complete search history.

(56) References Cited

U.S. PATENT DOCUMENTS

| 6,298,001 | B1 | 10/2001 | Lee et al. |
| 6,339,357 | B1 * | 1/2002 | Yamasaki et al. ............ 327/538 |
| 6,480,053 | B1 * | 11/2002 | Teramoto ..................... 327/408 |
| 6,549,480 | B1 | 4/2003 | Hosogane et al. |

FOREIGN PATENT DOCUMENTS

| JP | 9-92787 | 4/1997 |
| JP | 2001-153924 | 6/2001 |

* cited by examiner

*Primary Examiner*—Jeffrey Zweizig
(74) *Attorney, Agent, or Firm*—Hamre, Schumann, Mueller & Larson, P.C.

(57) ABSTRACT

A semiconductor integrated circuit device including a plurality of internal power supply generating circuits arranged on a single chip and a common monitor pad is provided. The internal power supply generating circuits are connected via respective switches to the common monitor pad, and the internal power supply generating circuits and the monitor pad are selectively connectable using the switches.

7 Claims, 9 Drawing Sheets

SEMICONDUCTOR INTEGRATED CIRCUIT DEVICE

BACKGROUND OF THE INVENTION

1. Field of the Invention

The present invention relates to a semiconductor integrated circuit device such as a dynamic random-access memory.

2. Description of Related Art

In an operation test of a semiconductor integrated circuit device, the number of pins for testing must be as many as the number of total pads. However, as the number of pins increases, cost rises. Accordingly, a conventional semiconductor integrated circuit device includes a common circuit for sharing part of the pads at the time of testing as disclosed in JP 9(1997)-92787 A, for example.

Figure 9:
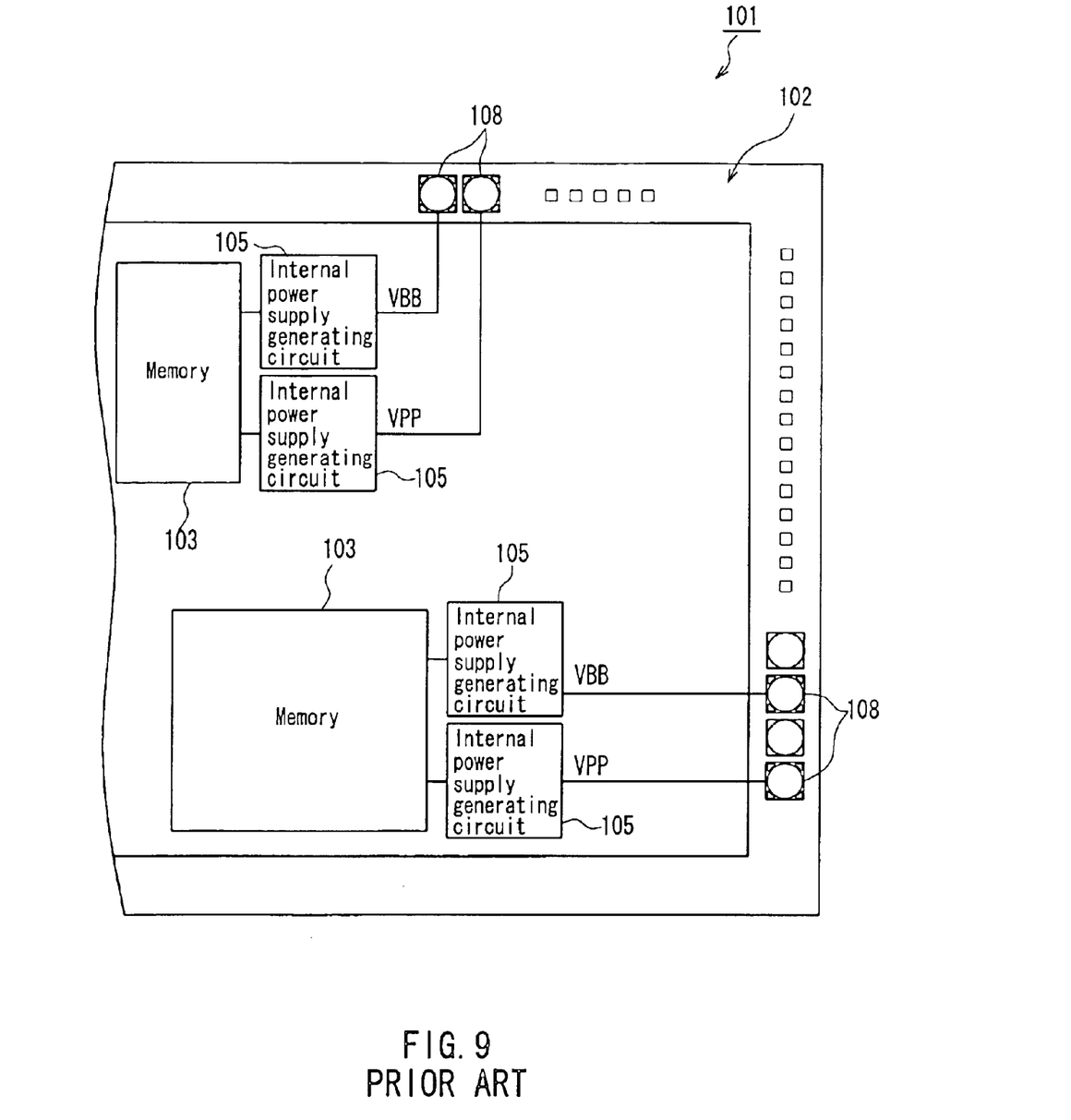
FIG. 9 is a block diagram showing a configuration of a conventional semiconductor integrated circuit device.

Further, in a semiconductor integrated circuit device with a configuration in which, besides an external power supply supplied externally, an internal power supply generated based on the external power supply is used, external pads are necessary for monitoring the internal power supply at the time of testing memories or the like or for forcibly applying a voltage externally instead of an internal power supply. As illustrated in FIG. 9, which shows a configuration of the conventional semiconductor integrated circuit device, external pads 108 for the above-mentioned internal power supply are provided at an external pad region 102 of a semiconductor integrated circuit device 101.

However, for inputting the external power supply or for monitoring the internal power supply at the time of memory test, it is necessary to provide at least as many external pads 108 as the number of internal power supply generating circuits 105 of embedded memories 103. Thus, when there are many memories 103, the number of the monitor pads 108 also increases accordingly.

The semiconductor integrated circuit device 101 with a logic circuit and a plurality of memories embedded in a single chip, which is called a system LSI and has been used commonly in recent years, has a high-pin-count configuration when considering the number of pins for the logic circuit as well. Consequently, in order to achieve a smaller area, it has becomes absolutely necessary to reduce the number of external pads used for memory test.

Moreover, since the number of pins that can be monitored by a memory tester is limited, complex adjustment has to be made for memory test when the number of the external pads 108 exceeds the limited number of pins. This also causes a problem that a test time cannot be shortened. On the other hand, in a semiconductor integrated circuit device having degenerate functions that are as many as I/Os, like the above-described semiconductor integrated circuit device disclosed in JP 9-92787 A, since characteristics of an internal power supply voltage vary between a normal operation period and a memory test period, the internal power supply voltage cannot be evaluated accurately.

SUMMARY OF THE INVENTION

In light of the problems described above, it is an object of the present invention to provide a semiconductor integrated circuit device that can achieve a lower cost and a smaller area without increasing the number of pads even when the number of internal power supply generating circuits has increased.

In order to achieve the above-mentioned object, a semiconductor integrated circuit device of the present invention includes a plurality of internal power supply generating circuits arranged on a single chip, and a common monitor pad. The internal power supply generating circuits are connected via respective switches to the common monitor pad, and the internal power supply generating circuits and the monitor pad are selectively connectable by the switches.

Accordingly, an external pad for monitoring an internal power supply or forcibly applying a voltage externally instead of the internal power supply (forcible application of power supply) can be shared by the plurality of internal power supply generating circuits. This decreases the number of external pads, making it possible to achieve a smaller area and a lower cost of a semiconductor integrated circuit device.

Further, it is preferable that the internal power supply generating circuits generate equal internal power supply voltages. This makes it possible to reduce loads of transistors or wirings that are connected to the external pads.

Moreover, each of the internal power supply generating circuits may generate an internal power supply based on an external power supply.

It also is preferable that all of the switches are capable of being turned off at the same time, and each of the switches is capable of being turned on or off selectively. With this configuration, during memory test, the internal power supply generated in each internal power supply generating circuit can be monitored.

Further, it is preferable that the switches include an N-channel transistor or a P-channel transistor. With this configuration, by controlling a gate voltage of the N-channel transistor or the P-channel transistor, it is possible to output an internal power supply in the cases of negative power supply voltage to boosted power supply voltage.

Moreover, it is preferable that the internal power supply generating circuits are capable of being all or selectively brought into a deactivated state. With this configuration, the internal power supply generating circuit supplied forcibly with a voltage is brought into the deactivated state at the time of forcibly applying the voltage externally instead of the internal power supply. Consequently, it is possible to prevent the generation of an abnormal current or a through current caused by a collision between an output of the internal power supply generating circuit and the forcibly applied voltage from outside and, as a result, a desired voltage can be applied.

Additionally, it is preferable that driver control portions further are connected to the internal power supply generating circuits. The driver control portions have a configuration of controlling a supply of a voltage to the internal power supply generating circuits. The voltage is input via an external pad. With this configuration, it is possible to achieve electric power savings of the power supply applied forcibly from outside. Also, the amount of electric current supply can be reduced.

Furthermore, the driver control portions may be provided respectively for the internal power supply generating circuits and controlled so as to operate in synchronization with the on and off of the switches.

In addition, it is preferable that voltage level shifting circuits are provided between the internal power supply generating circuits and the switches. The voltage level shifting circuits shift voltage levels of internal power supplies generated in the internal power supply generating circuits. This makes it possible to boost a negative power supply voltage to a positive voltage and lower a boosted power supply voltage. Accordingly, the switches can be made into an integrated circuit, and it is possible to supply easily a negative power supply used when the substrate has a twin-well structure.

DESCRIPTION OF THE PREFERRED EMBODIMENTS

First Embodiment

Figure 1:
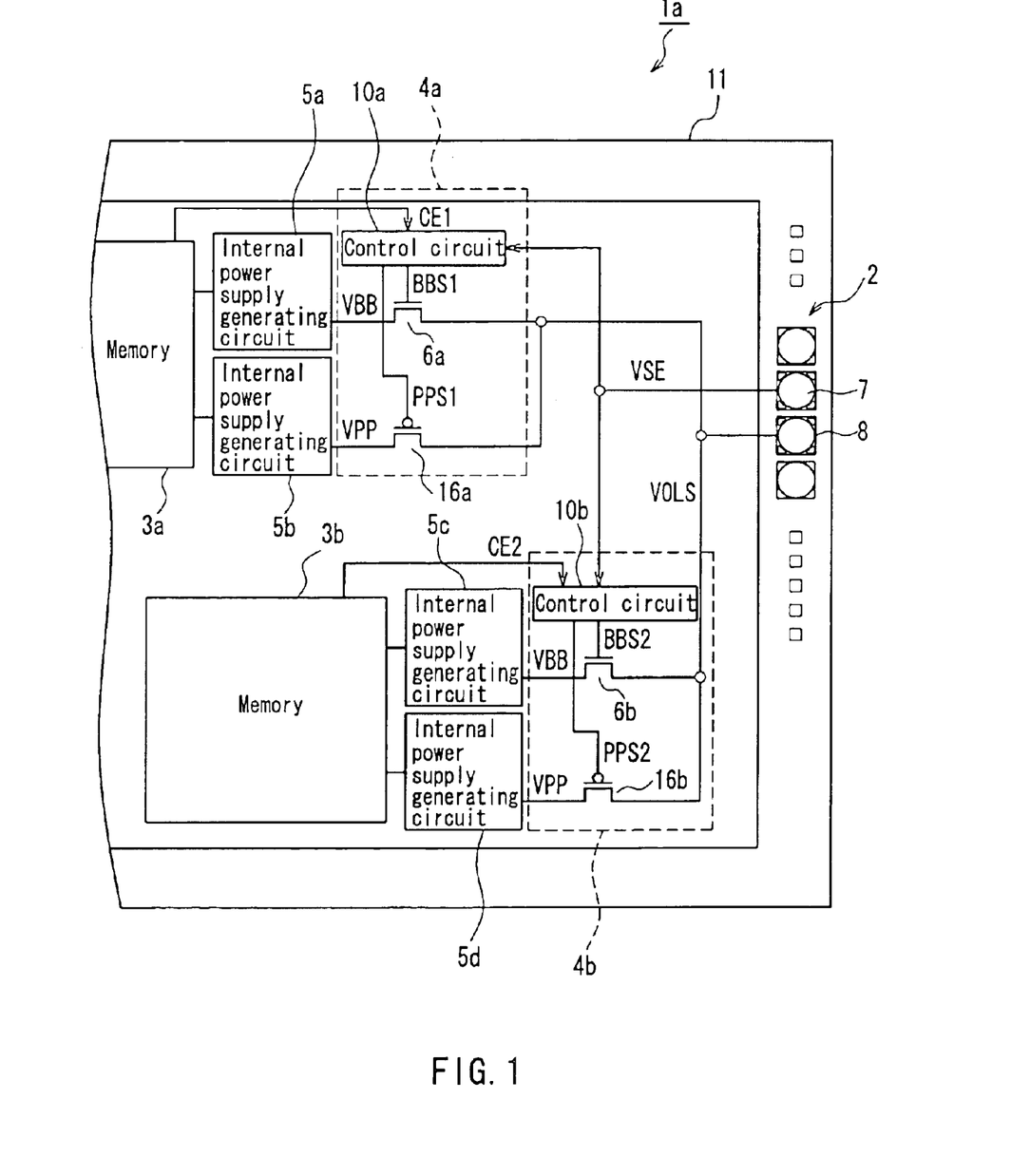
FIG. 1 is a block diagram showing a configuration of a semiconductor integrated circuit device according to a first embodiment of the present invention.

The following is a description of a semiconductor integrated circuit device according to a first embodiment of the present invention, with reference to FIG. 1. A semiconductor integrated circuit device 1a is a system LSI and has a configuration in which memories 3a and 3b serving as storage portions are embedded in a substrate 11.

Further, internal power supply generating circuits 5a, 5b, 5c and 5d for generating internal power supplies based on external power supplies and supplying the internal power supplies to the memories 3a and 3b and switch control portions 4a and 4b for controlling outputs of the internal power supply voltages generated in the internal power supply generating circuits 5a, 5b, 5c and 5d are provided on the substrate 11. The operation of the switch control portions 4a and 4b allows the internal power supply voltages not to be output during normal operation and to be output and monitored during memory test.

The memory 3a is supplied with the internal power supply voltages generated in the two internal power supply generating circuits 5a and 5b, whereas the memory 3b is supplied with the internal power supply voltages generated in the two internal power supply generating circuits 5c and 5d. Also, the switch control portion 4a controls the output of the internal power supply voltages generated in the internal power supply generating circuits 5a and 5b to a monitor pad 8, whereas the switch control portion 4b controls the output of the internal power supply voltages generated in the internal power supply generating circuits 5c and 5d to the monitor pad 8.

An outer periphery of the substrate 11 serves as an external pad region 2, in which various kinds of pads are provided. Those pads include a control pad 7 and the monitor pad 8. The control pad 7 receives a control signal VSE from the outside and transmits it to the switch control portions 4a and 4b. The control signal VSE controls the output of the internal power supply voltage to the monitor pad 8.

The switch control portion 4a includes a control circuit 10a, and an N-channel transistor 6a and a P-channel transistor 16a whose operations are controlled by the control circuit 10a, whereas the switch control portion 4b includes a control circuit 10b, and an N-channel transistor 6b and a P-channel transistor 16b whose operations are controlled by the control circuit 10b. In the case of using a plurality of internal power supply generating circuits for one memory as described above, a plurality of the N-channel transistors or the P-channel transistors serving as switches are used according to the number of the internal power supply generating circuits to be used, making it possible to control the outputs of the internal power supply generating circuits easily. Also, it is appropriate to use the N-channel transistors or the P-channel transistors depending on whether the internal power supply voltages are boosted power supply voltages or negative power supply voltages.

A selection signal CE1 for identifying the internal power supply voltage of the internal power supply generating circuits 5a and 5b to be output is input from outside via the memory 3a to the control circuit 10a. An internal power supply voltage VBB of the internal power supply generating circuit 5a is supplied via the N-channel transistor 6a to the monitor pad 8. Also, an internal power supply voltage VPP of the internal power supply generating circuit 5b is supplied via the P-channel transistor 16a to the monitor pad 8.

Similarly, a selection signal CE2 for identifying the internal power supply voltage of the internal power supply generating circuits 5c and 5d to be output from the memory 3b is input from outside via the memory 3a to the control circuit 10b. An internal power supply voltage VBB of the internal power supply generating circuit 5c is supplied via the N-channel transistor 6b to the monitor pad 8. Also, an internal power supply voltage VPP of the internal power supply generating circuit 5d is supplied via the P-channel transistor 16b to the monitor pad 8.

Figure 2:
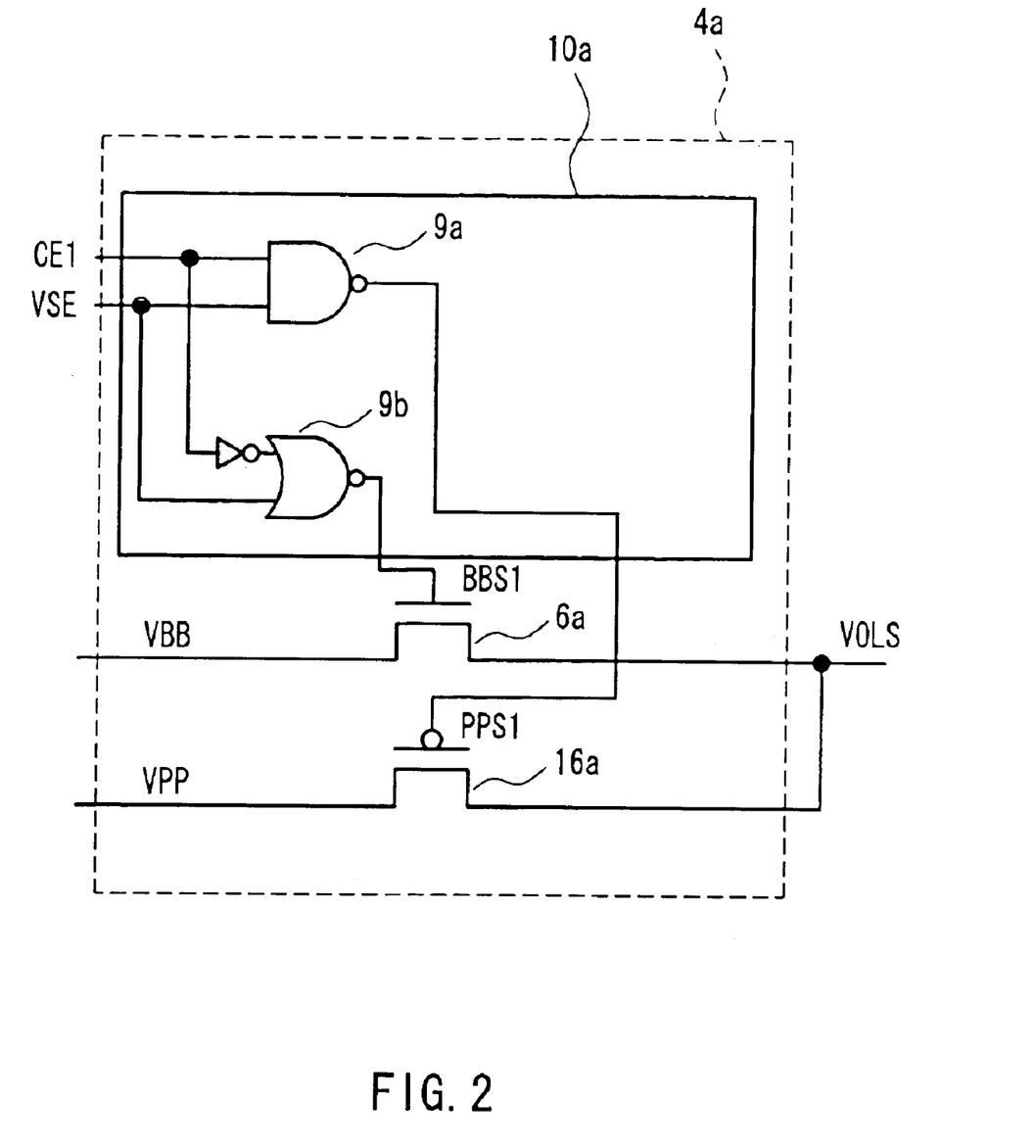
FIG. 2 is a circuit diagram showing a control circuit according to the first embodiment of the present invention.

FIG. 2 shows an example of the configuration of the switch control portion 4a. The control circuit 10a includes a NAND circuit 9a and a NOR circuit 9b. The selection signal CE1 and the control signal VSE are input to the NAND circuit 9a, and a switch control signal PPS1 is input to a gate of the P-channel transistor 16a. An inverted signal of the selection signal CE1 and the control signal VSE are input to the NOR circuit 9b, and a switch control signal BBS1 is input to a gate of the N-channel transistor 6a. With the circuit configuration described above, it is possible to control the N-channel transistor 6a and the P-channel transistor 16a according to the selection signal CE1 and the control signal VSE and thus control the supply of the internal power supply voltages VBB and VPP to the monitor pad 8.

The internal power supply voltage of the internal power supply generating circuit 5a or 5b selected in the switch control portion 4a is supplied to a common node VOLS. At the time of memory test, the internal power supply voltage of the internal power supply generating circuit 5a or 5b is supplied to the common node VOLS and can be monitored by the monitor pad 8.

It should be noted that the switch control portion 4b also has a configuration similar to the above.

Figure 3:
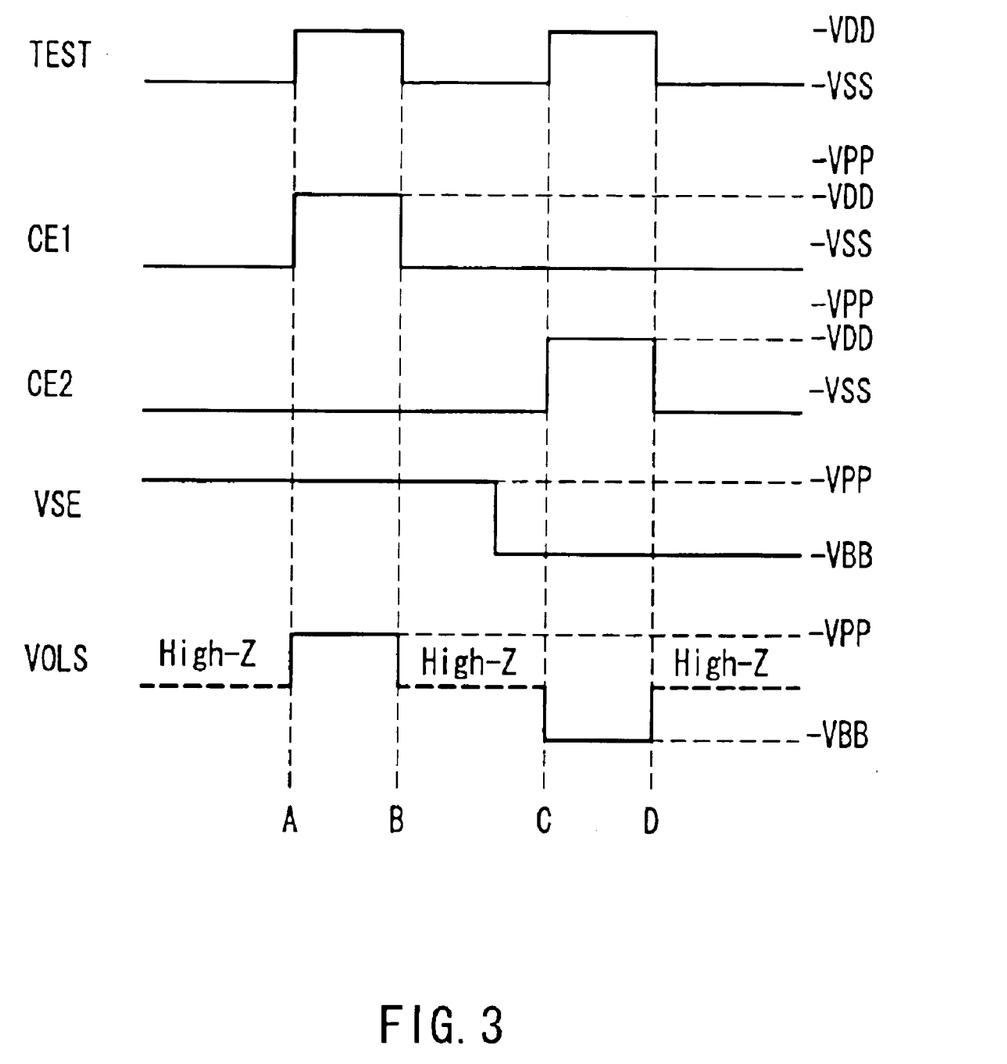
FIG. 3 is a timing chart of each signal in the semiconductor integrated circuit device according to the first embodiment of the present invention.

An operation of the semiconductor integrated circuit device 1a with the above-described configuration as shown in FIG. 1 will be described referring to a timing chart shown in FIG. 3. In FIG. 3, the period before cycle A is a normal operation mode, in which a signal TEST to be input to the memories 3a and 3b is at a ground voltage VSS. The selection signals CE1 and CE2 also are in a deactivated state. In the circuit configuration of FIG. 2, when the selection signals CE1 and CE2 are deactivated, all of the N-channel transistors 6a and 6b and the P-channel transistors 16a and 16b are cut off by the switch control signals BBS1, BBS2 and PPS1, PPS2. Thus, the internal power supply generating circuits 5a, 5b, 5c and 5d are not connected to the monitor pad 8, and the common node VOLS is in a High-Z (high-impedance) state.

In the cycle A, the signal TEST changes to an external power supply voltage VDD, and a memory test mode begins. Further, the selection signal CE1 alone is activated, and the control signal VSE input from the control pad 7 is at VPP. This turns on only the transistor controlled by the switch control signal PPS1. In other words, the internal power supply voltage VPP of the internal power supply generating circuit 5b alone is supplied to the common node VOLS and monitored by the monitor pad 8.

Next, in cycle B returning to the normal operation mode, the signal TEST changes to VSS, and the common node VOLS turns into the High-Z state.

Subsequently, in cycle C, the signal TEST changes to VDD again, and a memory test mode begins. The selection signal CE2 alone is activated, and the control signal VSE is at VBB. This turns on only the transistor controlled by the switch control signal BBS2. In other words, the internal power supply voltage VBB of the internal power supply generating circuit 5c alone is supplied to the common node VOLS and monitored by the monitor pad 8.

Finally, in cycle D returning to the normal operation mode, the common node VOLS similarly turns into the High-Z state.

In a similar manner, the combination of the selection signals CE1, CE2 and the control signal VSE can turn on each of the N-channel transistors 6a and 6b and the P-channel transistors 16a and 16b in the switch control portions 4a and 4b or turn off all of them at the same time. Thus, the internal power supply voltages of the internal power supply generating circuits 5a, 5b, 5c and 5d can be monitored selectively. This makes it possible to reduce the number of the external pads considerably, leading to a smaller area and a lower cost for the semiconductor integrated circuit device.

Furthermore, in the case of applying the external power supply forcibly to the memories 3a and 3b without using the internal power supply, it is appropriate that the switch control portions 4a and 4b connect the monitor pad 8 and the internal power supply generating circuits 5a, 5b, 5c and 5d of the desired memories 3a and 3b. In this state, the external power supply voltage is applied forcibly from the monitor pad 8 via the internal power supply generating circuits 5a, 5b, 5c and 5d to the memories 3a and 3b. Incidentally, in this case, the internal power supply generating circuits 5a, 5b, 5c and 5d are in the deactivated state and do not generate power supply voltages. By deactivating the internal power supply generating circuits 5a, 5b, 5c and 5d, it is possible to prevent a collision between the external power supply applied forcibly and the internal power supply generated internally, thus avoiding the generation of an abnormal current or a through current.

If existing signals such as the control signal VSE and the selection signals CE1 and CE2 are used for the control of deactivating the internal power supply generating circuits 5a, 5b, 5c and 5d, it is possible to deactivate these circuits 5a, 5b, 5c and 5d selectively, further reducing the external pads and leading to a smaller area.

As described above, in accordance with the semiconductor integrated circuit device 1a of the first embodiment, it is possible to monitor the internal power supply of each of the internal power supply generating circuits 5a, 5b, 5c and 5d at the time of memory test or apply the external power supply forcibly to the memories 3a and 3b by using the common control pad 7 and the monitor pad 8 alone even when a plurality of the memories 3a and 3b are embedded in a single chip. This can reduce the number of the external pads, achieving a smaller area of the semiconductor integrated circuit device.

Moreover, since the switch control portions 4a and 4b are provided in the semiconductor integrated circuit device 1a not only at the time of monitoring the internal power supply and forcibly applying the external power supply but also at the time of normal operation, there occurs no variation in the characteristics of the internal power supply voltage between the normal operation period and the memory test period. Therefore, the internal power supply can be evaluated accurately.

Second Embodiment

Figure 4:
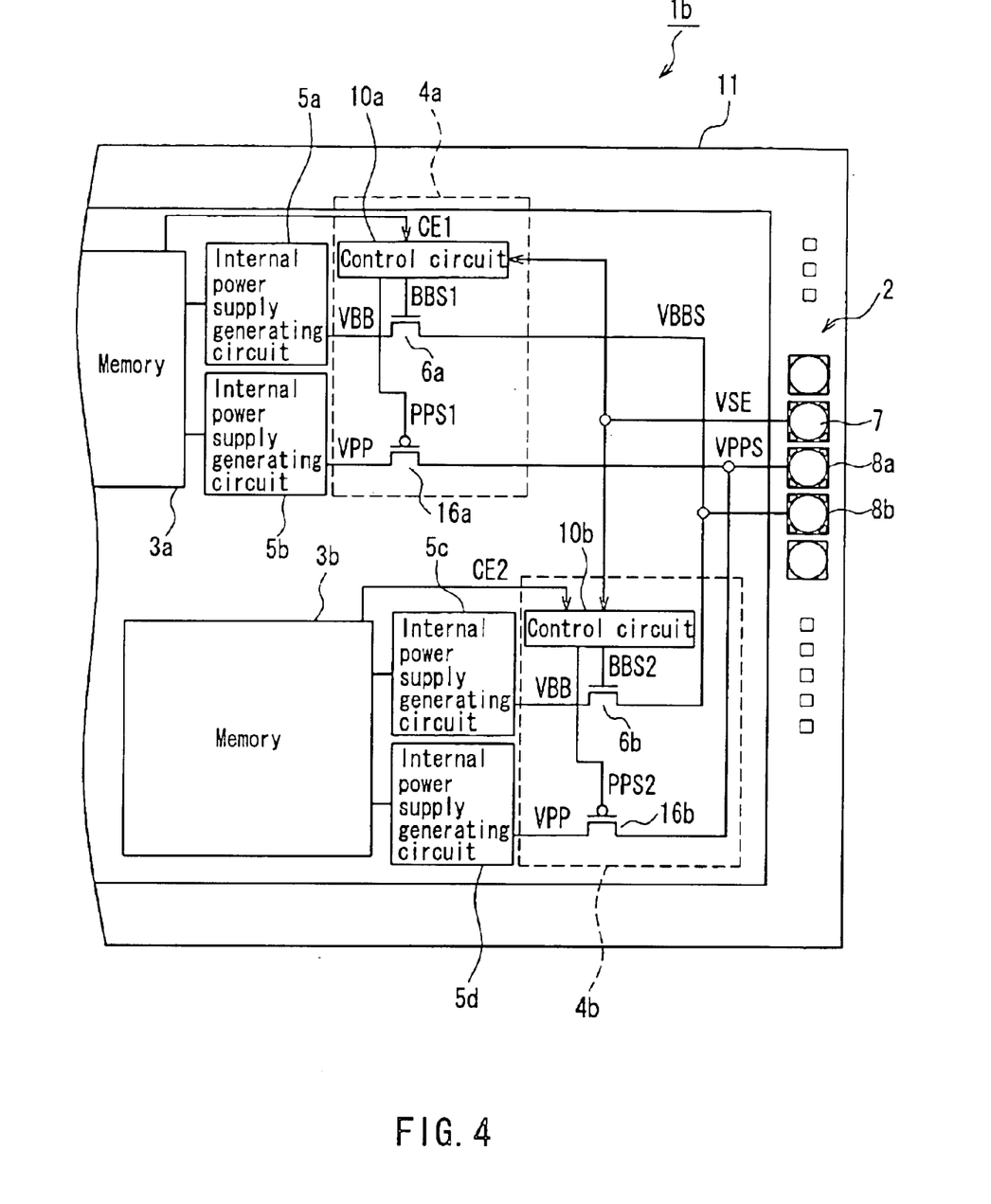
FIG. 4 is a block diagram showing a configuration of a semiconductor integrated circuit device according to a second embodiment of the present invention.

The following is a description of a semiconductor integrated circuit device according to a second embodiment of the present invention, with reference to FIG. 4. A semiconductor integrated circuit device 1b of the second embodiment is different from that in the first embodiment in that outputs having equal electric potentials from among outputs of the internal power supply generating circuits 5a, 5b, 5c and 5d are connected to the same monitor pad.

The semiconductor integrated circuit device 1b includes as the external pads two monitor pads 8a and 8b other than the control pad 7. In the first embodiment, the internal power supply voltages generated in the internal power supply generating circuits 5a, 5b, 5c and 5d are supplied to the same monitor pad 8 regardless of whether they are VBB or VPP. In contrast, in the semiconductor integrated circuit device 1b according to the second embodiment, the internal power supply voltage is supplied to the monitor pad 8a when it is VPP and supplied to the monitor pad 8b when it is VBB.

More specifically, the internal power supply voltage VBB of the internal power supply generating circuit 5a is equal to the internal power supply voltage VBB of the internal power supply generating circuit 5c. Then, they are supplied via the switch control portions 4a and 4b to the common node VBBS and both monitored by the monitor pad 8b. Also, the internal power supply voltage VPP of the internal power supply generating circuit 5b is equal to the internal power supply voltage VPP of the internal power supply generating circuit 5d. Then, they are supplied via the switch control portions 4a and 4b to the common node VPPS and both monitored by the monitor pad 8a.

The switch control operations in the monitoring of the internal power supply during memory test, forcible application of the external power supply voltage etc. in the semiconductor integrated circuit device 1b of the second embodiment are similar to those in the first embodiment. Thus, the description thereof will be omitted here.

In the semiconductor integrated circuit device 1b of the second embodiment, since the internal power supplies supplied to the memory 3a from the internal power supply generating circuits 5a and 5b are of two different kinds, i.e., VPP and VBB and monitored by the different monitor pads 8a and 8b, such different internal power supplies can be monitored at the same time. The same is true for the memory 3b. Thus, as described above, by achieving the configuration in which the internal power supplies having equal electric potentials are supplied to the common monitor pad, it is possible to monitor the internal power supply for each of the memories 3a and 3b easily.

In addition, the semiconductor integrated circuit device 1b of the second embodiment can reduce the load of wirings or transistors connected to one monitor pad.

Third Embodiment

Figure 5:
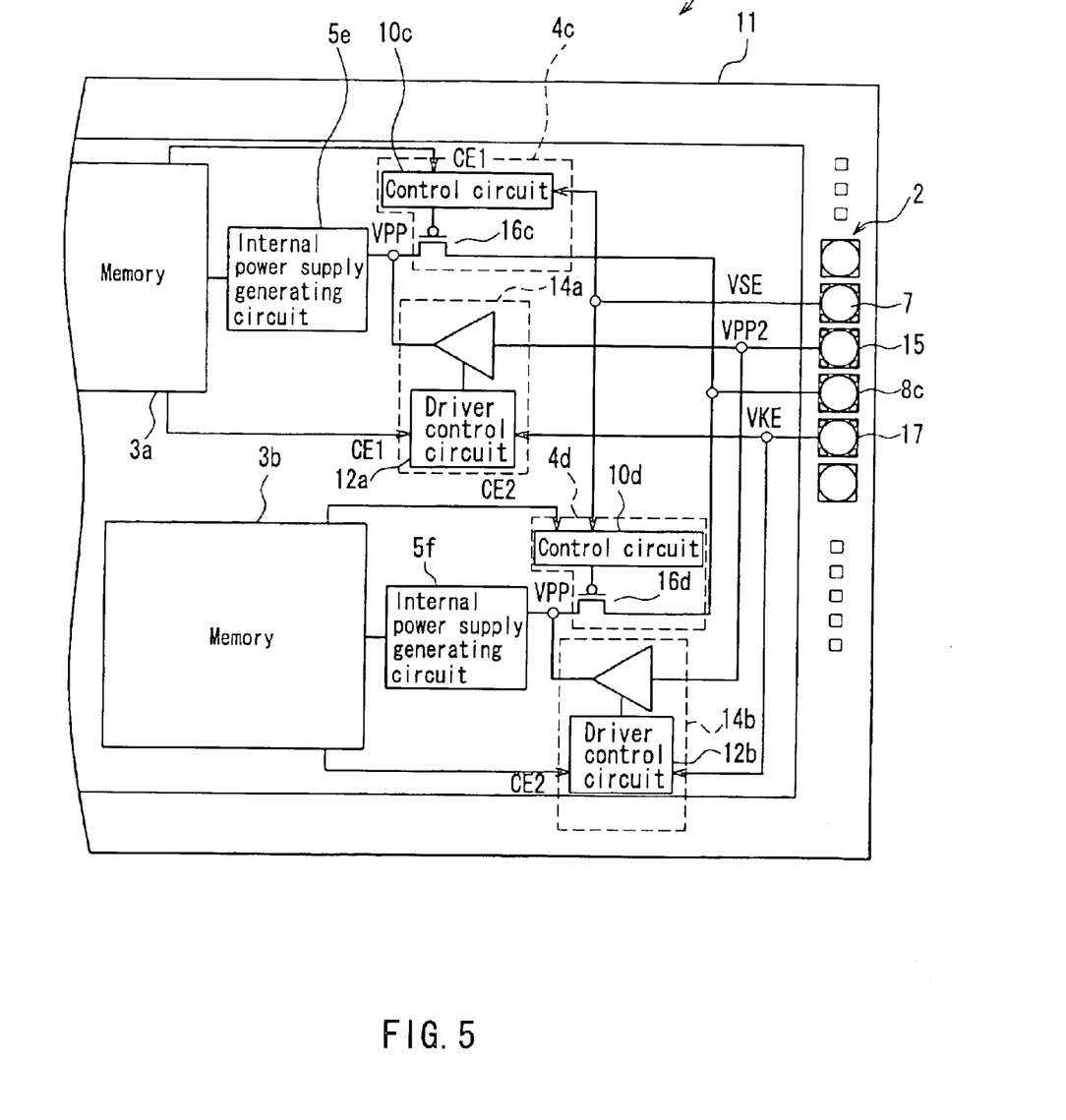
FIG. 5 is a block diagram showing a configuration of a semiconductor integrated circuit device according to a third embodiment of the present invention.

The following is a description of a semiconductor integrated circuit device according to a third embodiment of the present invention, with reference to FIG. 5. A semiconductor integrated circuit device 1c of the third embodiment is a system LSI having memories 3a and 3b provided on a substrate 11. Further, internal power supply generating circuits 5e and 5f provided respectively for the memories 3a and 3b, switch control portions 4c and 4d for controlling outputs of internal power supply voltages and driver control portions 14a and 14b are formed on the substrate 11. Also, an external pad region 2 on an outer periphery of the substrate 11 is provided with external pads including a control pad 7, a forcible application pad 15, a monitor pad 8c and a control pad 17.

The internal power supply generating circuits 5e and 5f are connected via the switch control portions 4c and 4d to the monitor pad 8c. The switch control portions 4c and 4d respectively include P-channel transistors 16c and 16d and control circuits 10c and 10d for controlling them. The driver control portions 14a and 14b respectively supply forcible application voltage VPP2, which is an external power supply voltage input from the forcible application pad 15, to the internal power supply generating circuits 5e and 5f based on an application control signal VKE input from the control pad 17.

Figure 6:
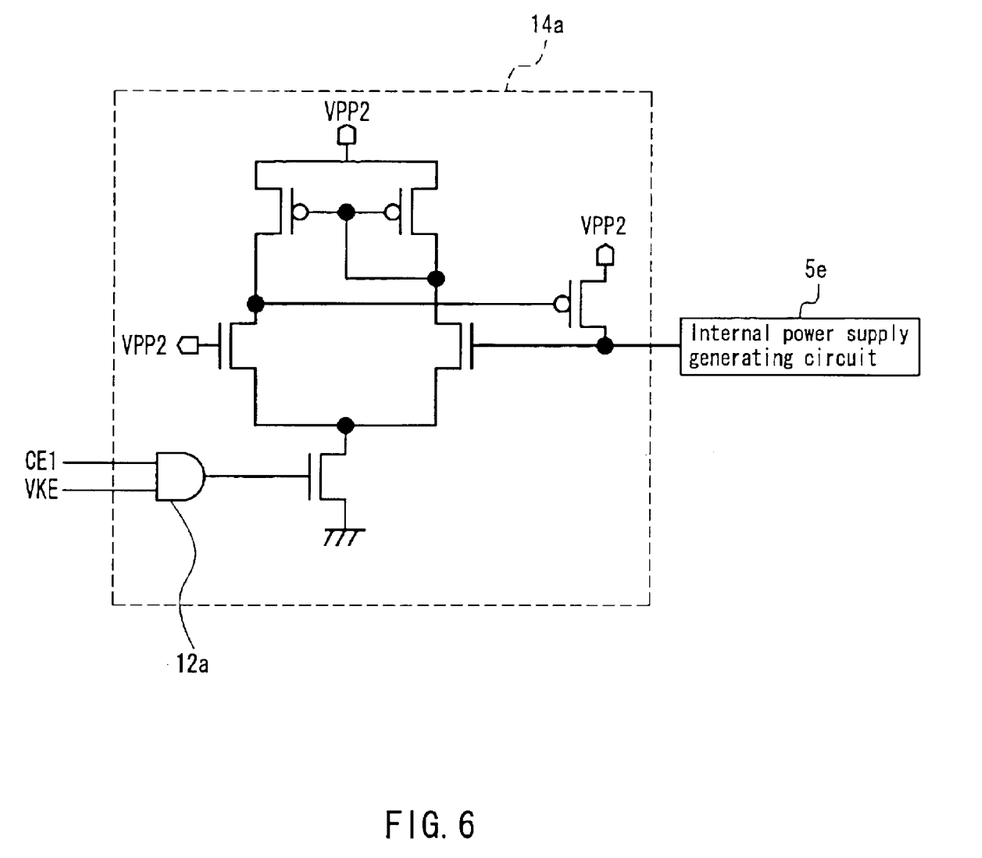
FIG. 6 is a circuit diagram showing a driver control portion according to the third embodiment of the present invention.

The driver control portion 14a has, for example, a circuit configuration as shown in FIG. 6, including a circuit of a differential amplifier driver configuration and an AND circuit serving as a driver control circuit 12a for controlling the circuit of the differential amplifier driver configuration. With this differential amplifier driver configuration, it is possible to achieve power savings of the external power supply to be supplied. The AND circuit (the driver control circuit 12a) activates the differential amplifier based on the selection signal CE1 and the application control signal VKE. It should be noted that the driver control portion 14b also has a configuration similar to the above.

An operation of the semiconductor integrated circuit device 1c with the above-described configuration as shown in FIG. 5 will be described. First, in the memory test, when monitoring the internal power supply voltage, the application control signal VKE is turned off. In this way, the driver control portions 14a and 14b are turned off and not subjected to the forcible application of the external power supply voltage. Using a switch control signal VSE and the selection signals CE1 and CE2, the control circuits 10c and 10d are controlled, thereby turning on the P-channel transistor connected to the output of a desired internal power supply generating circuit. This allows monitoring of a desired internal power supply from the monitor pad 8c. Incidentally, during the memory test, the driver control portions 14a and 14b may be turned off/on in synchronization with the on/off of the P-channel transistor of the switch control portions 4c and 4d, respectively.

The following description is directed to the case of forcibly applying the power supply externally. Using the application control signal VKE and the selection signals CE1 and CE2, a desired driver control portion 14a or 14b is turned on, and a desired external power supply voltage is supplied to the internal power supply generating circuit 5e or 5f. At this time, the switch control portions 4c and 4d may be turned on for monitoring or turned off.

At the time of normal operation, the switch control portions 4c and 4d are turned off so that the outputs of the internal power supply generating circuits 5e and 5f are not supplied to the monitor pad 8c. Furthermore, the driver control portions 14a and 14b also are turned off so that the external forcible application power supply is not applied.

As described above, the semiconductor integrated circuit device 1c of the third embodiment is provided with the driver control portions 14a and 14b for supplying the voltages to the internal power supply generating circuits 5e and 5f, whereby the forcible application pad serving as an external pad other than the monitor pad for outputting the internal power supply voltage is used to input the external power supply voltage. Consequently, the load of each external pad is reduced, thus increasing a current supply capacity and achieving electric power savings.

It should be noted that the semiconductor integrated circuit device of the first embodiment or the second embodiment may be provided with driver circuits similarly to the semiconductor integrated circuit device of the third embodiment.

Fourth Embodiment

Figure 7:
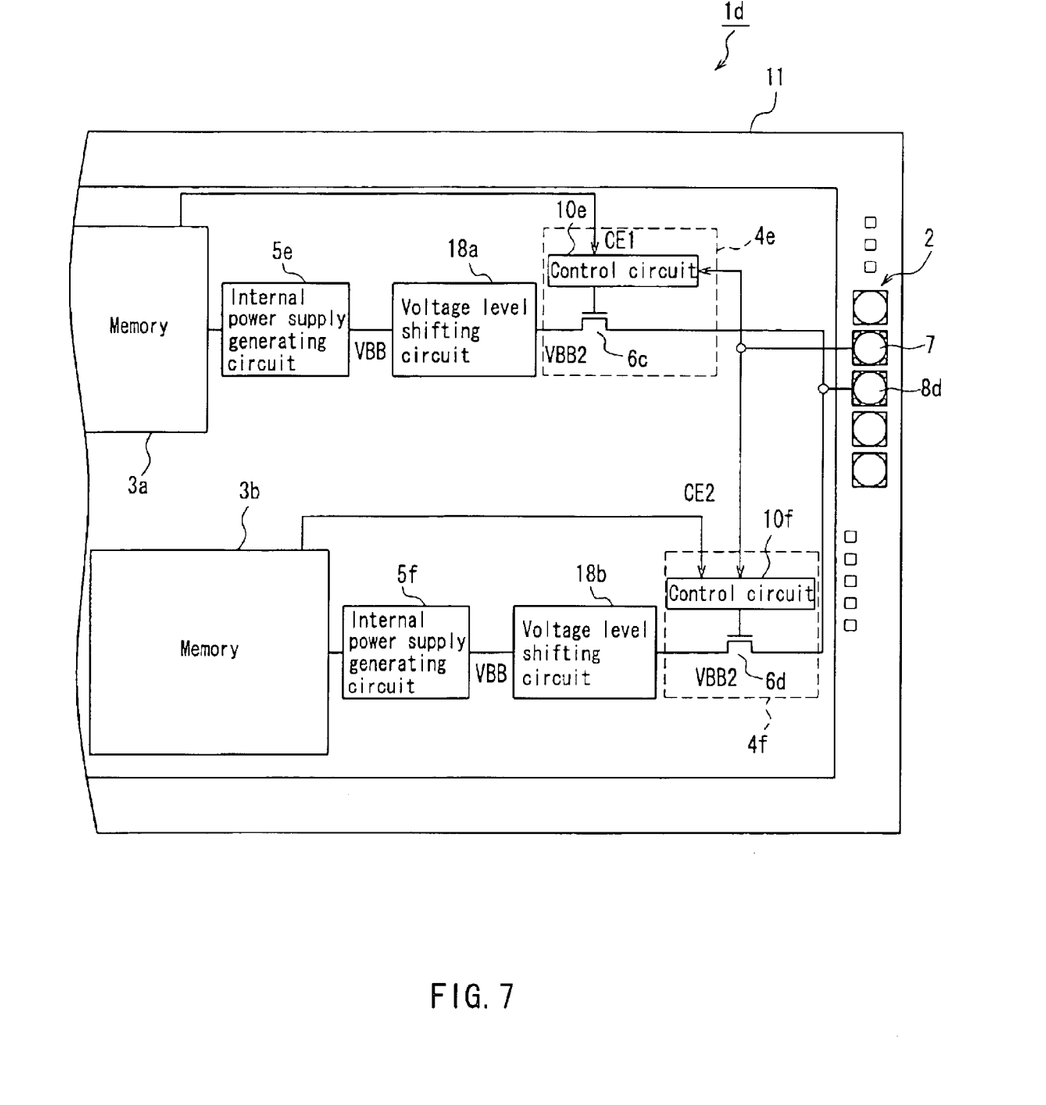
FIG. 7 is a block diagram showing a configuration of a semiconductor integrated circuit device according to a fourth embodiment of the present invention.

The following is a description of a semiconductor integrated circuit device according to a fourth embodiment of the present invention, with reference to FIG. 7. A semiconductor integrated circuit device 1d of the fourth embodiment is a system LSI having memories 3a and 3b provided on a substrate 11. Further, besides the memories 3a and 3b, internal power supply generating circuits 5e and 5f provided respectively for the memories 3a and 3b, switch control portions 4e and 4f for controlling outputs of internal power supply and voltage level shifting circuits 18a and 18b are formed on the substrate 11. Also, an external pad region 2 on an outer periphery of the substrate 11 is provided with external pads including a control pad 7 and a monitor pad 8d.

The internal power supply generating circuits 5e and 5f are connected via the voltage level shifting circuits 18a and 18b and the switch control portions 4e and 4f to the control pad 7. The switch control portions 4e and 4f respectively include N-channel transistors 6c and 6d and control circuits 10e and 10f for controlling the N-channel transistors 6c and 6d.

Figure 8:
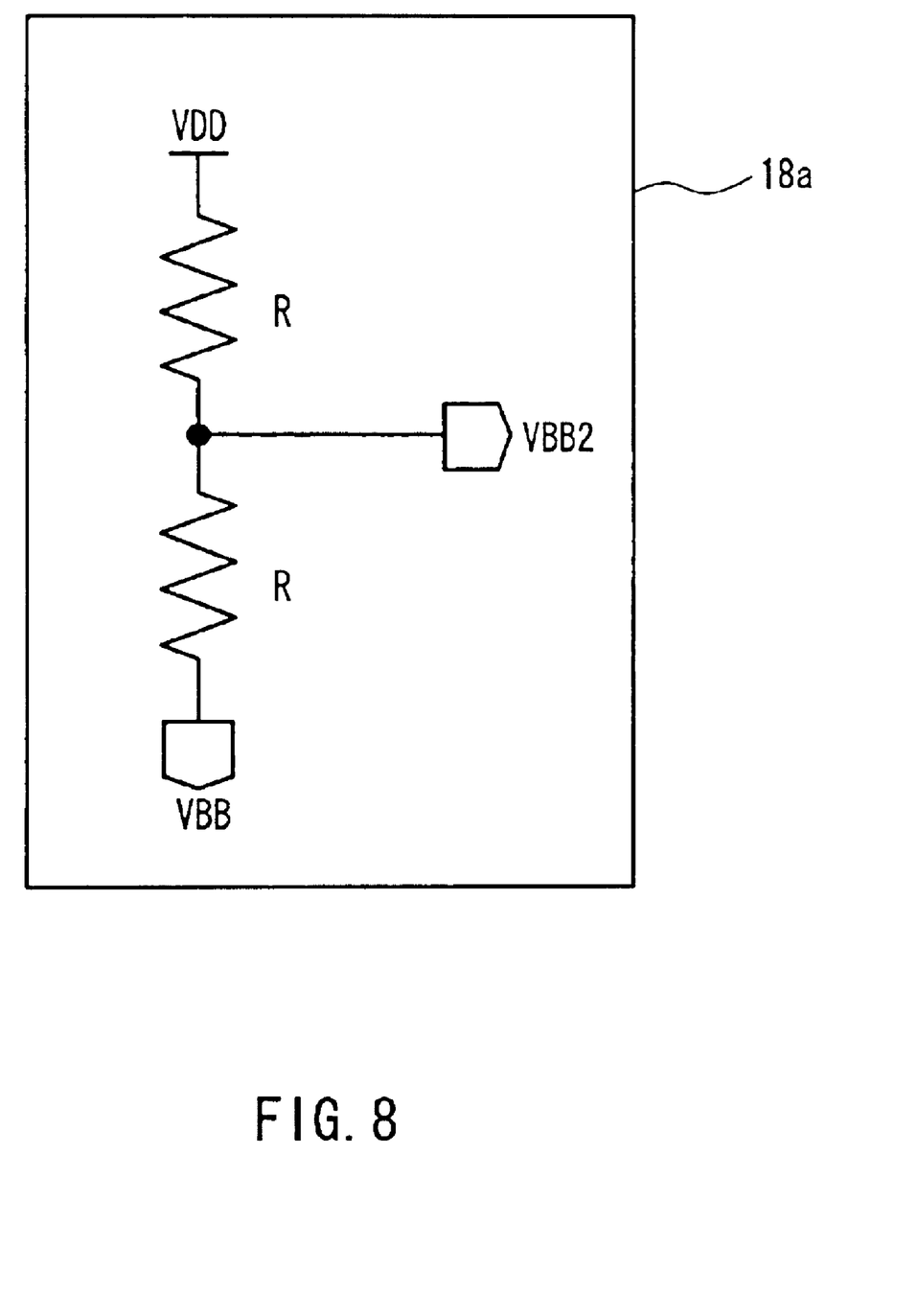
FIG. 8 is a circuit diagram showing a voltage level shifting circuit according to the fourth embodiment of the present invention.

The voltage level shifting circuit 18a has, for example, a circuit configuration as shown in FIG. 8. An internal power supply voltage VBB generated by the internal power supply generating circuit 5e is at an electric potential at a negative level for controlling a substrate voltage. The internal power supply voltage VBB is shifted to a voltage VBB2 midway between an external power supply voltage VDD and the internal power supply voltage VBB by the voltage level shifting circuit 18a. At the time of memory test, the shifted voltage VBB2 is supplied via the switch control portion 4e to the monitor pad 8d. It should be noted that the voltage level shifting circuit 18b also has a configuration similar to the above.

By providing the voltage level shifting circuits 18a and 18b, the voltage level can be shifted to an optimal voltage especially in the case where the internal power supply has a higher voltage than the external power supply or the internal power supply is a negative power supply. Thus, there is no need for a complex circuit configuration of the switch control portions 4e and 4f at the subsequent stage. Also, in the case where the substrate 11 has a twin-well structure and a negative power supply voltage is used in the memories 3a and 3b, the voltage level can be shifted to a positive power supply voltage, thereby simplifying the circuit configuration of the switch control portions 4e and 4f.

As described above, in accordance with the semiconductor integrated circuit devices of the first to fourth embodiments, even in the system LSI with a configuration in which a plurality of memories including internal power supply circuits are embedded in a single chip, it is possible to inspect the memories and apply the external power supply forcibly without the need for increasing the number of external pads. Consequently, a semiconductor integrated circuit device that can achieve a lower cost and a smaller area can be provided.

The first to fourth embodiments have illustrated an example of the internal power supply generating circuits for generating internal power supplies to be used for memories. However, there is no particular limitation to the memories, and the present invention can be applied to any semiconductor integrated circuit as long as it includes an internal power supply generating circuit.

The circuit configurations illustrated specifically in the first to fourth embodiments are merely examples, and the present invention is by no means limited to these specific examples.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor integrated circuit device comprising:
   a plurality of internal power supply generating circuits arranged on a single chip; and
   a common monitor pad;
   wherein the internal power supply generating circuits are connected via respective switches to the common monitor pad,
   the internal power supply generating circuits and the monitor pad are selectively connectable by the switches, and
   the internal power supply generating circuits generate equal internal power supply voltage.

2. The semiconductor integrated circuit device according to claim 1, wherein each of the internal power supply generating circuits generates an internal power supply based on an external power supply.

3. The semiconductor integrated circuit device according to claim 1, wherein all of the switches are capable of being turned off at the same time, and each of the switches is capable of being turned on or off selectively.

4. The semiconductor integrated circuit device according to claim 1, wherein each of the switches is an N-channel transistor or a P-channel transistor.

5. A semiconductor integrated circuit device comprising:
   a plurality of internal power supply generating circuits arranged on a single chip; and
   a common monitor pad;
   wherein the internal power supply generating circuits are connected via respective switches to the common monitor pad,
   the internal power supply generating circuits and the monitor pad are selectively connectable by the switches, and
   the internal power supply generating circuits are capable of being all or selectively brought into a deactivated state; and
   driver control portions connected to the internal power supply generating circuits,
   wherein the driver control portions control a supply of a voltage to the internal power supply generating circuits, the voltage being input via an external pad.

6. The semiconductor integrated circuit device according to claim 5, wherein the driver control portions are provided respectively for the internal power supply generating circuits, and the driver control portions and the switches are controlled by a common control signal.

7. A semiconductor integrated circuit device comprising:
   a plurality of internal power supply generating circuits arranged on a single chip;
   a common monitor pad; and
   voltage level shifting circuits between the internal power supply generating circuits and the switches;
   wherein the internal power supply generating circuits are connected via respective switches to the common monitor pad,
   the internal power supply generating circuits and the monitor pad are selectively connectable by the switches, and
   the voltage level shifting circuits shift voltage levels of internal power supplies generated in the internal power supply generating circuits.

* * * * *